(12) United States Patent
Sasaoka et al.

(10) Patent No.: US 11,452,215 B2
(45) Date of Patent: Sep. 20, 2022

(54) WIRING CIRCUIT BOARD, PRODUCING METHOD THEREOF, AND WIRING CIRCUIT BOARD ASSEMBLY SHEET

(71) Applicant: NITTO DENKO CORPORATION, Osaka (JP)

(72) Inventors: Ryosuke Sasaoka, Osaka (JP); Naoki Shibata, Osaka (JP); Yasunari Oyabu, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 17/265,925

(22) PCT Filed: Jul. 12, 2019

(86) PCT No.: PCT/JP2019/027651
§ 371 (c)(1),
(2) Date: Feb. 4, 2021

(87) PCT Pub. No.: WO2020/031613
PCT Pub. Date: Feb. 13, 2020

(65) Prior Publication Data
US 2021/0185832 A1    Jun. 17, 2021

(30) Foreign Application Priority Data

Aug. 10, 2018   (JP) .............................. JP2018-152020

(51) Int. Cl.
*H05K 1/02* (2006.01)
*H05K 1/14* (2006.01)
(Continued)

(52) U.S. Cl.
CPC ............... *H05K 3/425* (2013.01); *H05K 1/02* (2013.01); *H05K 3/10* (2013.01); *H05K 3/22* (2013.01);
(Continued)

(58) Field of Classification Search
CPC ............ H05K 1/02; H05K 1/14; H05K 1/056; H05K 1/0393; H05K 3/02; H05K 3/10;
(Continued)

(56) References Cited

U.S. PATENT DOCUMENTS

2005/0272276 A1    12/2005  Ooyabu
2006/0169486 A1*   8/2006   Funada ................ H05K 3/0052
                                                                 174/254
(Continued)

FOREIGN PATENT DOCUMENTS

JP    2000-091733 A    3/2000
JP    2003-258405 A    9/2003
(Continued)

OTHER PUBLICATIONS

International Preliminary Report on Patentability issued by WIPO dated Feb. 16, 2021, in connection with International Patent Application No. PCT/JP2019/027651.
(Continued)

*Primary Examiner* — Xiaoliang Chen
(74) *Attorney, Agent, or Firm* — Edwards Neils LLC; Jean C. Edwards (57) ABSTRACT

A method for producing a wiring circuit board includes a first step of preparing a wiring circuit board assembly sheet including a support sheet, a plurality of wiring circuit boards supported by the support sheet, and a joint connecting the support sheet to the plurality of wiring circuit boards, having
(Continued)

flat-shaped one surface and the other surface facing one surface at spaced intervals thereto in a thickness direction, and having a thin portion in which the other surface is recessed toward one surface and a second step of forming a burr portion protruding toward the other side in the thickness direction and cutting the thin portion.

6 Claims, 8 Drawing Sheets (51) Int. Cl.
*H05K 3/02* (2006.01)
*H05K 3/10* (2006.01)
*H05K 3/22* (2006.01)
*H01L 21/56* (2006.01)
*H01L 23/31* (2006.01)
*H01L 23/495* (2006.01)
*H01L 23/544* (2006.01)
*H05K 3/42* (2006.01)

(52) U.S. Cl.
CPC ..... *H05K 3/02* (2013.01); *H05K 2201/09209* (2013.01); *H05K 2203/0228* (2013.01); *H05K 2203/03* (2013.01); *H05K 2203/14* (2013.01)

(58) Field of Classification Search
CPC ...... H05K 3/22; H05K 3/0052; H05K 3/0097; H05K 3/425; H01L 21/56; H01L 21/565; H01L 23/31; H01L 23/3107; H01L 23/495; H01L 23/544; H01L 23/49541; H01L 24/06; H01L 24/45; H01L 24/49; H01L 24/73

USPC ........... 174/250, 254; 348/34, 731; 361/749, 361/784

See application file for complete search history.

(56) References Cited

U.S. PATENT DOCUMENTS

| 2011/0141376 | A1* | 6/2011 | Tsubata | G02F 1/136213 |
| | | | | 438/34 |
| 2013/0340823 | A1 | 12/2013 | Ong et al. | |
| 2014/0084452 | A1 | 3/2014 | Nagamatsu et al. | |
| 2017/0141044 | A1* | 5/2017 | Kitajo | H01L 23/544 |
| 2017/0309551 | A1* | 10/2017 | Ikeda | H01L 21/565 |
| 2018/0204788 | A1* | 7/2018 | Ikeda | H01L 24/06 |

FOREIGN PATENT DOCUMENTS

| JP | 2005-340385 A | 12/2005 |
| JP | 2006-123308 A | 5/2006 |
| JP | 2013-258405 A | 12/2013 |
| JP | 2014-076528 A | 5/2014 |
| JP | 2015-029078 A | 2/2015 |
| WO | 2013/018344 A1 | 2/2013 |

OTHER PUBLICATIONS

International Search Report Issued in PCT/JP2019/027651 dated Sep. 24, 2019.
Written Opinion Issued in PCT/JP2019/027651 dated Sep. 24, 2019.
Office Action issued by the Japanese Patent Office dated Jul. 5, 2022, in connection with Japanese Patent Application No. 2018-152020.

* cited by examiner

FIG. 8

WIRING CIRCUIT BOARD, PRODUCING METHOD THEREOF, AND WIRING CIRCUIT BOARD ASSEMBLY SHEET

CROSS-REFERENCE TO RELATED APPLICATIONS

The present application is a 35 U.S.C. 371 National Stage Entry PCT/JP2019/027651, filed on Jul. 12, 2019, which claims priority Japanese Patent Application No. 2018-152020, filed on Aug. 10, 2018, the contents of all of which are herein incorporated by reference in their entirety.

TECHNICAL FIELD

The present invention relates to a wiring circuit board, a method for producing a wiring circuit board, and a wiring circuit board assembly sheet, to be specific, to a wiring circuit board, a method for producing a wiring circuit board, and a wiring circuit board assembly sheet used therein.

BACKGROUND ART

Conventionally, a method of obtaining a circuit board has been known in which a material substrate for connecting a plurality of circuit boards via a narrow piece is prepared, and next, the narrow piece is cut to disconnect the circuit board from the material substrate (ref for example, Patent Document 1).

The material substrate has one surface and the other surface which are two flat surfaces facing each other in a thickness direction.

CITATION LIST

Patent Document

Patent Document 1. Japanese Unexamined Patent Publication No 2000-91733

SUMMARY OF THE INVENTION

Problem to be Solved by the Invention

However, when the narrow piece is cut, in a cut remaining portion of the narrow piece, burr pieces are likely to occur. Specifically, when the narrow piece is cut by pressing a cutting blade on one surface of the narrow piece, or a laser beam is irradiated to the other surface of the narrow piece, the burr pieces protruding from the other surface toward the other side in the thickness direction easily occur.

In this case, there is a problem that one surface in the thickness direction of the circuit board including the cut remaining portion is not flat, therefore, handleability of the circuit board decreases, and furthermore, when the circuit board is mounted on another substrate so as to bring one surface of the circuit board into contact with the flat surface of the other substrate, mountability of the circuit board decreases.

The present invention provides a wiring circuit board having excellent handleability and excellent mountability, a method for producing a wiring circuit board, and a wiring circuit board assembly sheet.

Means for Solving the Problem

The present invention (1) includes a method for producing a wiring circuit board including a first step of preparing a wiring circuit board assembly sheet including a support sheet, a plurality of wiring circuit boards supported by the support sheet, and a joint connecting the support sheet to the plurality of wiring circuit boards, having flat-shaped one surface and the other surface facing one surface at spaced intervals thereto in a thickness direction, and having a thin portion in which the other surface is recessed toward one surface and a second step of forming a burr portion protruding toward the other side in the thickness direction and cutting the thin portion.

In the second step of the method for producing a wiring circuit board, since the thin portion recessed toward one surface is cut, even when the burr portion is formed so as to protrude toward the other side in the thickness direction, it is possible to locate the burr portion at one side in the thickness direction with respect to the other surface around the thin portion. Therefore, it is possible to suppress a decrease in handleability of the wiring circuit board, and thus, suppress a decrease in mountability of the wiring circuit board.

The present invention (2) includes the method for producing a wiring circuit board described in (1), wherein in the second step, a cutting blade is brought into contact with one surface.

In the second step of the method for producing a wiring circuit board, since the cutting blade is used, it is possible to easily cut the thin portion.

The present invention (3) includes the method for producing a wiring circuit board described in (2), wherein the support sheet includes a direct connection portion to which the joint is directly connected, the direct connection portion has a fragile portion, and in the second step, the fragile portion is simultaneously cut with the thin portion.

However, when the joint includes the direct connection portion without having the fragile portion, and in the second step, the direct connection portion is simultaneously cut with the thin portion, a cutting blade in contact with the thin portion can cut the thin portion with a relatively small shearing force, and the cutting blade in contact with the direct connection portion cannot cut the thick direct connection portion unless it has a larger shearing force. Furthermore, the shearing force applied to the thick direct connection portion is easily increased as compared with the shearing force applied to the thin portion, therefore, a difference between the shearing force applied to the direct connection portion and the shearing force applied to the thin portion becomes excessive, as a result, the posture of the cutting blade at the time of cutting becomes unstable, and the cutting accuracy is likely to decrease.

However, in the method for producing a wiring circuit board, since the direct connection portion has the fragile portion, it is possible to cut the fragile portion with the cutting blade in contact with the fragile portion with a relatively small shearing force. Therefore, it is possible to simultaneously cut both the thin portion and the direct connection portion using the cutting blade with a relatively small shearing force.

Moreover, it is possible to make the shearing force applied to the fragile portion the same degree as the shearing force applied to the thin portion. Therefore, it is possible to stabilize the posture of the cutting blade at the time of cutting and suppress a decrease in the cutting accuracy.

Further, since the pressure of the cutting blade in contact with the thin portion decreases, it is possible to decrease an amount of protrusion of the burr portion toward the other side in the thickness direction as much as possible. As a result, it is possible to further suppress a decrease in the handleability of the wiring circuit board, and thus, further suppress a decrease in the mountability of the wiring circuit board.

Furthermore, since it is possible to decrease the load onto the cutting blade, it is possible to decrease the number of replacements of the cutting blade, and as a result, it is possible to decrease the production cost.

The present invention (4) includes the method for producing a wiring circuit board described in (3), wherein the fragile portion includes a second thin portion and/or a through hole.

In the method for producing a wiring circuit board, since the fragile portion includes the second thin portion and/or the through hole, it is possible to reliably cut the fragile portion with even a small shearing force.

The present invention (5) includes the method for producing a wiring circuit board described in (1), wherein in the second step, a laser beam is irradiated to the other surface.

In the second step of the method for producing a wiring circuit board, since the laser beam is used, it is possible to accurately cut the thin portion.

The present invention (6) includes the method for producing a wiring circuit board described in any one of (1) to (5), wherein the wiring circuit board has a recessed portion recessed inwardly from an outer peripheral end edge when viewed in the thickness direction, and the thin portion is disposed at the inside of the recessed portion so as to be located inwardly with respect to a phantom outer peripheral line along the outer peripheral end edge when viewed in the thickness direction.

However, in the second step, when the thin portion is located outwardly with respect to the phantom outer peripheral line the thin portion is likely to interfere at the time of handling or mounting the wiring circuit board.

However, in the method for producing a wiring circuit board, since in the second step, the thin portion is disposed at the inside of the recessed portion so as to be located inwardly with respect to the phantom outer peripheral line along the outer peripheral end edge when viewed in the thickness direction, it is possible to locate the burr portion inwardly with respect to the phantom outer peripheral line. Therefore, the thin portion in which the burr portion is formed does not interfere, and it is possible to further suppress a decrease in the handleability and the mountability of the wiring circuit board.

The present invention (7) includes a wiring circuit board assembly sheet including a support sheet, a plurality of wiring circuit boards supported by the support sheet, and a joint connecting the support sheet to the plurality of wiring circuit boards and having flat-shaped one surface and the other surface facing one surface at spaced intervals thereto in a thickness direction, wherein the joint has a thin portion in which the other surface is recessed toward one surface.

In the wiring circuit board assembly sheet, since the joint has the thin portion in which the other surface is recessed toward one surface, when the thin portion recessed toward one surface is cut, it is possible to locate the burr portion formed in the thin portion at one side in the thickness direction with respect to the other surface around the thin portion. Therefore, it is possible to suppress a decrease in the handleability of the wiring circuit board, and thus, suppress a decrease in the mountability of the wiring circuit board.

The present invention (8) includes a wiring circuit board including an outer peripheral portion, wherein the outer peripheral portion has a cut remaining portion protruding outwardly, the cut remaining portion has a base end portion and a free end portion continuous from one end portion in a thickness direction of the base end portion and having a thickness thinner than the base end portion, an outer end edge of the free end portion has a burr portion protruding toward the other side in the thickness direction, and the burr portion is overlapped with the base end portion when projected in a protruding direction of the cut remaining portion.

In the wiring circuit board, since the burr portion is overlapped with the base end portion when projected in the protruding direction of the cut remaining portion, the burr portion is located at one side in the thickness direction with respect to the other surface around the thin portion. Therefore, the wiring circuit board can suppress a decrease in the handleability and thus, suppress a decrease in the mountability.

Effect of the Invention

According to the wiring circuit board, the method for producing a wiring circuit board, and the wiring circuit board assembly sheet of the present invention, it is possible to suppress a decrease in handleability and mountability of the wiring circuit board.

BRIEF DESCRIPTION OF THE DRAWINGS

FIGS. 3A and 3B show cross-sectional views of the joint shown in FIG. 2:

FIGS. 7A and 7B show bottom views of a modified example of a fragile portion shown in FIG. 2.

DESCRIPTION OF EMBODIMENTS

One embodiment of a wiring circuit board, a method for producing a wiring circuit board, and a wiring circuit board assembly sheet of the present invention is described with reference to FIGS. 1 to 5.

Figure 1:
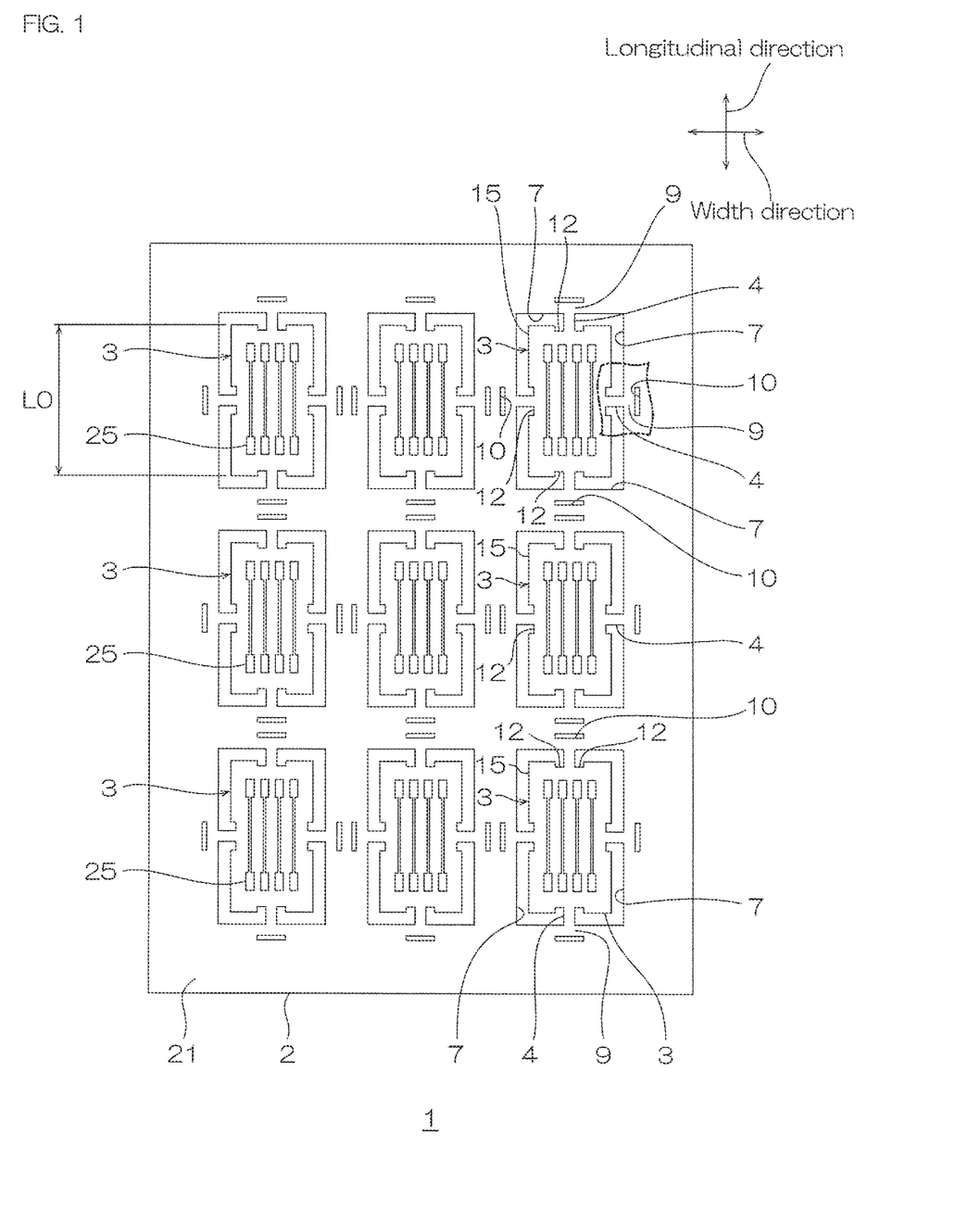
FIG. 1 shows a plan view of one embodiment of a wiring circuit board assembly sheet of the present invention.
Figure 2:
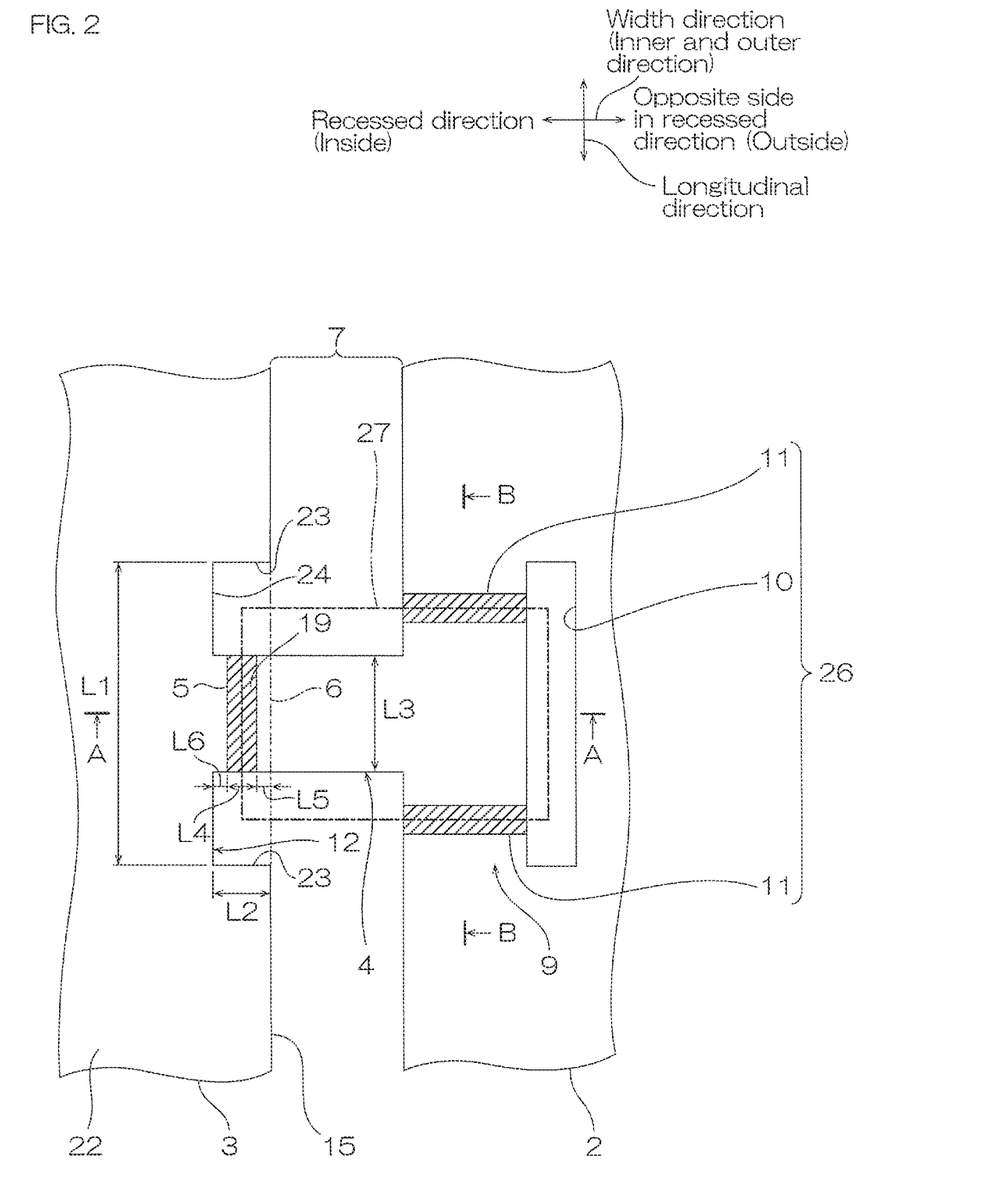
FIG. 2 shows an enlarged bottom view of a joint of the wiring circuit board assembly sheet shown in FIG. 1.

In FIG. 1, a region shown by a thick broken line shows a region drawn in FIG. 2. In FIG. 2, a thick one-dot chain line draws a line through which a cutting blade 27 (described later) passes. In FIG. 2, a first thin portion 5 (described later) and a second thin portion 1 (described later) are drawn by hatching in order to clearly show the relative arrangement of these.

Figure 3A:
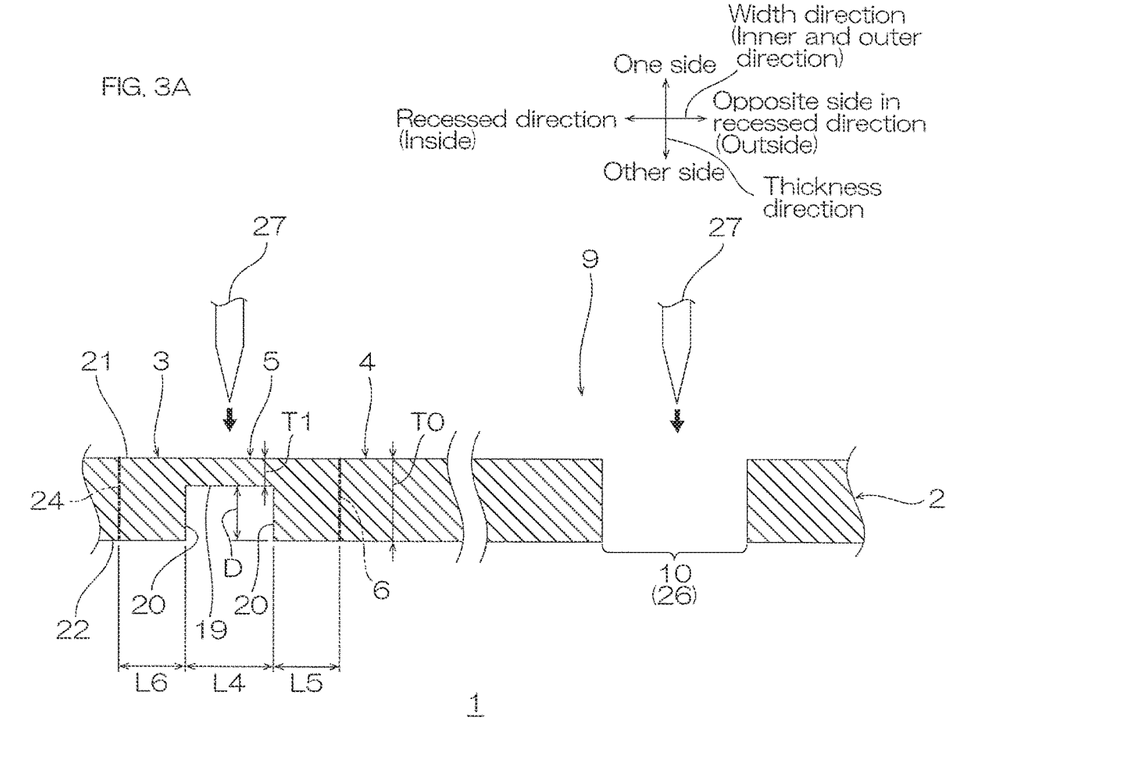
FIG. 3A illustrating a cross-sectional view along an A-A line of FIG. 2.
Figure 3B:
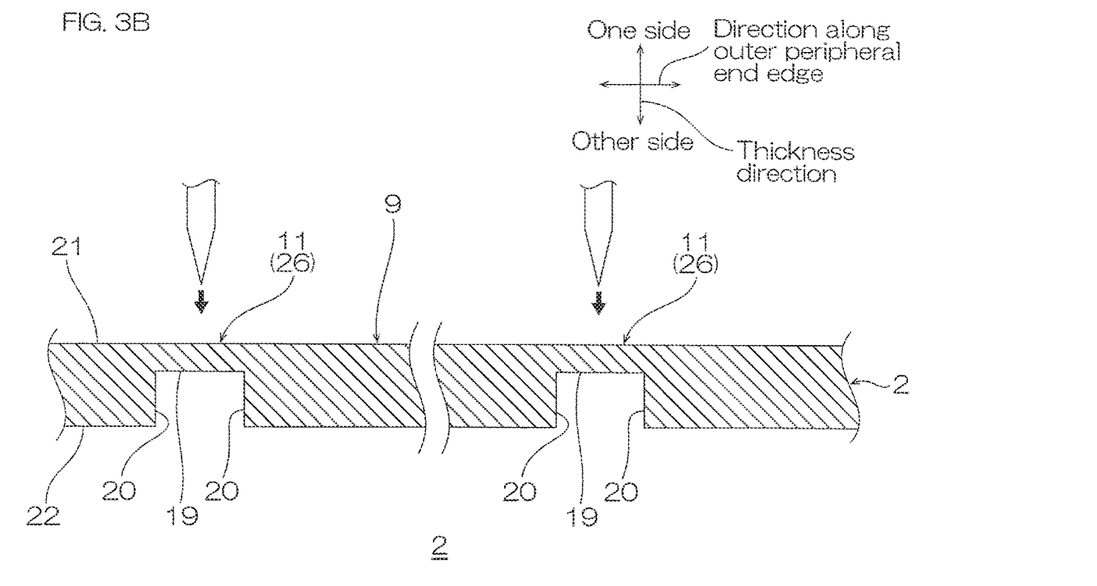
FIG. 3B illustrating a cross-sectional view along a B-B line of FIG. 2.

As shown in FIG. 1, a wiring circuit board assembly sheet 1 has a generally rectangular sheet shape extending along a longitudinal direction (direction in which a wiring circuit board 3 to be described later extends) (one direction of directions perpendicular to a thickness direction). As shown in FIGS. 3A to 3B, the wiring circuit board assembly sheet 1 has a one surface 21 and an other surface 22 facing each other in the thickness direction. As shown in FIGS. 1 to 2, the wiring circuit board assembly sheet 1 includes a support sheet 2, a wiring circuit board 3, and a joint 4.

The support sheet 2 has the same outer shape as that of the wiring circuit board assembly sheet 1 when viewed from the top. The support sheet 2 has a generally lattice shape when viewed from the top. As shown in FIGS. 3A to 3B, the support sheet 2 includes the one surface 21 and the other surface 22 described above.

As shown in FIGS. 1 to 2, in the support sheet 2, a plurality of first opening portions 7 formed around the wiring circuit board 3 to be described next are formed corresponding to the wiring circuit board 3. Further, the support sheet 2 includes a direct connection portion 9 to which the joint 4 is directly connected. In the support sheet 2, the plurality of direct connection portions 9 are formed corresponding to the wring circuit board 3.

Examples of a material for the support sheet 2 include a metal-based material and resins such as polyimide. Preferably, a metal-based material is used Examples of the metal-based material include metal elements classified in the Group 1 to Group 16 in the Periodic Table, and alloys including two or more kinds of metal elements. The metal-based material may be any of transition metals and typical metals. More specifically, examples of the metal-based material include Group 2 metal elements such as calcium, Group 4 metal elements such as titanium and zirconium. Group 5 metal elements such as vanadium, Group 6 metal elements such as chromium, molybdenum and tungsten. Group 7 metal elements such as manganese, Group 8 metal elements such as iron, Group 9 metal elements such as cobalt, Group 10 metal elements such as nickel and platinum, Group 11 metal elements such as copper, silver, and gold, Group 12 metal elements such as zinc, Group 13 metal elements such as aluminum and gallium, and Group 14 metal elements such as germanium and tin. As the metal-based material, preferably, an alloy is used, more preferably, a copper alloy is used.

Further, the support sheet 2 may be a plurality of layers made of different kinds of materials.

A thickness of the support sheet 2 is, for example, 1 μm or more, preferably 10 μm or more, and for example, 10 mm or less, preferably 1 mm or less.

The plurality of wiring circuit boards 3 are disposed in alignment at spaced intervals to each other in the longitudinal direction and a width direction (direction perpendicular to the longitudinal direction and the thickness direction) in the support sheet 2. Each of the wiring circuit boards 3 is disposed at the inside of the first opening portion 7, and is connected to the direct connection portion 9 of the support sheet 2 via the joint 4.

The wiring circuit board 3 has a generally rectangular plate shape when viewed from the top along the longitudinal direction Specifically, the wiring circuit board 3 has an outer peripheral end edge 15 having a generally rectangular shape when viewed from the top. That is, the outer peripheral end edge 15 of the one wiring circuit board 3 includes two first end edges facing each other at spaced intervals in the longitudinal direction, and two second end edges facing each other at spaced intervals in the width direction and connecting both end edges in the width direction of the two first end edges.

Further, as shown in FIGS. 3A to 3B, the wiring circuit board 3 has the one surface 21 and the other surface 22 described above.

Further, as shown in FIGS. 1 to 2, the wiring circuit board 3 has a recessed portion 12 recessed inwardly from the outer peripheral end edge 15. The plurality of recessed portions 12 are provided corresponding to the plurality of joints 4 to be described later. Specifically, the plurality of recessed portions 12 have a portion (i.e, one per one first end edge) cut into a generally rectangular shape from each of the two first end edges in the outer peripheral end edge 15 inwardly in the longitudinal direction, and a portion (i e, one per one second end edge) cut into a generally rectangular shape from each of the two second end edges in the outer peripheral end edge 15 inwardly in the width direction.

As shown in FIG. 2, the recessed portion 12 is partitioned by two first sides 23 continuous to the corresponding outer peripheral end edge 15, and a second side 24 connecting a front end edge in a recessed direction in each of the two first sides 23.

The two first sides 23 are oppositely disposed at spaced intervals to each other in a direction along the corresponding outer peripheral end edge 15. Each of the two first sides 23 forms, for example, a right angle with respect to the corresponding outer peripheral end edge 15.

The second side 24 is located at the inside (in the recessed direction) with respect to a phantom outer peripheral line 6 along the outer peripheral end edge 15 at spaced intervals thereto. For example, the second side 24 is parallel with the phantom outer peripheral line 6 along the corresponding outer peripheral end edge 15.

The wiring circuit board 3 includes a metal support layer (not shown), a base insulating layer (not shown), a conductive layer 25, and a cover insulating layer in order in the thickness direction. In the wiring circuit board 3, the metal support layer forms the other surface 22 in the thickness direction (ref. FIG. 3A), and the cover insulating layer forms the one surface 21 in the thickness direction (ref. FIG. 3. A material for the metal support layer and the conductive layer 25 is, for example, the same as the metal-based material illustrated in the support sheet 2. A material for the base insulating layer and the cover insulating layer is, for example, the same as the resin illustrated in the support sheet 2.

A dimension of the wiring circuit board 3 is appropriately set in accordance with its application and purpose. A thickness of the wiring circuit board 3 is, for example, 1 μm or more, preferably 10 μm or more, and for example, 10 mm or less, preferably 1 mm or less.

As shown in FIG. 2, an opposing length L1 of the two first sides 23 is a length of the second side 24, and is, for example, 100 mm or less, preferably 10 mm or less, and for example, 0.01 mm or more, preferably 0.05 mm or more. A ratio (L1/L0) of the opposing length L1 of the two first sides 23 to a length L0 of the corresponding outer peripheral end edge 15 (ref: FIG. 1) is, for example, 100 or less, preferably 1 or less, and for example, $2 \times 10^{-5}$ or more, preferably $2 \times 10^{-4}$ or more.

A length L2 of the first side 23 is a distance between the phantom outer peripheral line 6 and the second side 24, and is also a recessed amount (depth) of the recessed portion 12. The length L2 of the first side 23 is, for example, 0.001 mm or more, preferably 0.01 mm or more, and for example, 10 mm or less, preferably 1 mm or less. Further, a ratio (L2/L1)

of the length L2 of the first side 23 to the opposing length L1 of the two first sides 23 is, for example, $2 \times 10^{-6}$ or more, preferably $2 \times 10^{-3}$ or more, and for example, 1 or less, preferably 0.2 or less.

As shown in FIGS. 1 to 2, the four joints 4 are provided corresponding to the four recessed portions 12 provided in the one wiring circuit board 3. The joint 4 traverses the first opening portion 7 when viewed from the top, and connects the wiring circuit board 3 to the support sheet 2. Specifically, the joint 4 is directly connected to the direct connection portion 9 (described later) provided in the support sheet 2 so as to bridge the first opening portion 7 from the second side 24 of the recessed portion 12. The support sheet 2 suspends the wiring circuit board 3 by the joint 4 (described later) traversing the first opening portion 7. More specifically, the joint 4 has a shape of extending from the central portion in a direction along the outer peripheral end edge 15 in the second side 24 toward the outside of the joint 4 (opposite side of the recessed portion 12 in the recessed direction), and then, reaching the direct connection portion 9. The joint 4 has a generally rectangular plate shape when viewed from the top that is long from the wiring circuit board 3 along the direction toward the outside. As shown in FIGS. 3A to 3B, the joint 4 has the one surface 21 and the other surface 22 described above.

The one surface 21 of the joint 4 has a flat shape. The other surface 22 of the joint 4 has a flat shape in the outer-side region from the first thin portion 5 to be described next (region other than the first thin portion 5).

A material and a layer configuration of the joint 4 are the same as those of the support sheet 2. When the support sheet 2 is made of a metal-based material, and the wiring circuit board 3 includes the metal support layer, the joint 4 is preferably made of the metal-based material, specifically, forms a metal-based plate made of the metal-based material, and the metal-based plate connects the support sheet 2 to the metal support layer of the wiring circuit board 3.

Then, as shown in FIGS. 2 to 3A, the joint 4 has the first thin portion 5 as one example of a thin portion. The first thin portion 5 is disposed in the front end portion (inner end portion) (the wiring circuit board 3-side end portion) in the recessed direction of the recessed portion 12 in the joint 4. Specifically, the first thin portion 5 is disposed at the inside of the recessed portion 12 so as to be located inwardly with respect to the phantom outer peripheral line 6 along the outer peripheral end edge 15 when viewed in the thickness direction.

The first thin portion 5 is a recessed portion (first recessed portion) in which the other surface 22 is recessed toward the one surface 21 in the joint 4. The other surface 22 of the first thin portion 5 includes a ceiling surface 19 and two side surfaces 20.

The ceiling surface 19 is disposed at one side in the thickness direction with respect to the other surface 22 around the first thin portion 5 in the joint 4. Thus, the ceiling surface 19 is overlapped with the joint 4 around the first thin portion 5 and the wiring circuit board 3 when projected in an inner and outer direction (recessed direction of the recessed portion 12) of the wiring circuit board 3. The ceiling surface 19 has a generally rectangular shape when viewed from the bottom along the outer peripheral end edge 15.

The two side surfaces 20 are an inner-side surface extending from both end edges in the inner and outer direction of the ceiling surface 19 toward the other side in the thickness direction. The other end edges in the thickness direction of the two side surfaces 20 are connected to the other surface 22 around the first thin portion 5. The two side surfaces 20 are oppositely disposed so as to be parallel with each other, and form a generally right angle with respect to the ceiling surface 19.

On the other hand, the one surface 21 of the first thin portion 5 forms one flat surface continuous with the one surface 21 around the first thin portion 5 in the joint 4. That is, they are flush with each other.

A dimension of the joint 4 is appropriately set in accordance with its application and purpose. Specifically, as shown in FIG. 2, a width (length in a direction perpendicular to a direction in which the joint 4 extends and the thickness direction) L3 of the joint 4 is smaller than the opposing length L1 of the two first sides 23, and a ratio (L3/L1) of L3 to L1 is, for example, 0.5 or less, preferably 0.3 or less, and for example, 0.05 or more, preferably 0.1 or more. Specifically, the width L3 of the joint 4 is, for example, 100 mm or less, preferably 10 mm or less, and for example, 10 µm or more, preferably 50 µm or more.

A width (length in the inner and outer direction) L4 of the first thin portion 5 is, for example, 0.1 µm or more, preferably 1 µm or more, and for example, 10 mm or less, preferably 1 mm or less. A distance L5 between the first thin portion 5 and the phantom outer peripheral line 6 (specifically, a distance between the side surface 20 disposed outside of the two side surfaces 20 and the phantom outer peripheral line 6) is, for example, 0.01 m or more, preferably 1 µm or more, and for example, 10 mm or less, preferably 1 mm or less. A distance L6 between the first thin portion 5 and the second side 24 (specifically, a distance between the side surface 20 disposed inside of the two side surfaces 20 and the second side 24) is, for example, 0.01 m or more, preferably 1 µm or more, and for example, 10 mm or less, preferably 1 mm or less.

L4/[L4+L5+L6] is, for example, $1 \times 10^{-3}$ or more, preferably 0.1 or more, and for example, 1 or less, preferably 0.8 or less.

Further, L5/L2 is, for example, $1 \times 10^{-3}$ or more, preferably 0.1 or more, and for example, 1 or less, preferably 0.8 or less.

Furthermore, L6/L2 is, for example, $1 \times 10^{-3}$ or more, preferably 0.1 or more, and for example, 1 or less, preferably 0.8 or less.

As shown in FIG. 3A, a thickness T1 of the first thin portion 5 is, for example, 10 mm or less, preferably 1 mm or less, and for example, 1 µm or more, preferably 10 µm or more. Further, a ratio (T1/T0) of the thickness T1 of the first thin portion 5 to a thickness T0 of a portion around the first thin portion 5 is, for example, 0.7 or less, preferably 0.4 or less, and for example, 0.01 or more, preferably 0.1 or more.

Further, a depth D of the ceiling surface 19 of the first thin portion 5 from the other surface 22 around the first thin portion 5 is a value (T0-T1) obtained by subtracting the thickness T1 of the first thin portion 5 from the thickness T0 of the portion around the first thin portion 5. The depth D is, for example, 10 mm or less, preferably 1 mm or less, and for example, 1 µm or more, preferably 10 µm or more. A ratio (D/T0) of the depth D to the thickness T0 of the portion around the first thin portion 5 is, for example, 0.7 or less, preferably 0.4 or less, and for example, 0.01 or more, preferably 0.1 or more.

Subsequently, the direct connection portion 9 is described.

As shown in FIGS. 1 to 2, the direct connection portion 9 is a region directly connected to the joint 4 in the support sheet 2. Specifically, the direct connection portion 9 is a portion which is oppositely disposed at the outside of each of the recessed portions 12 of the wiring circuit board 3 in the support sheet 2.

The direct connection portion 9 has a fragile portion 26. The fragile portion 26 has the second thin portion 11 and a second opening portion 10.

The second thin portion 11 is disposed in both end portions in a direction in which the outer peripheral end edge 15 extends in the direct connection portion 9. As shown in FIGS. 3A to 3B, the second thin portion 11 has the same configuration as the first thin portion 5. That is, specifically, the second thin portion 11 has the ceiling surface 19 and the two side surfaces 20. Each ceiling surface 19 of the two second thin portions 11 is disposed at one side in the thickness direction with respect to the other surface 22 around the second thin portion 11 in the direct connection portion 9, and the second thin portion 11 is a recessed portion (second recessed portion) in which the other surface 22 (the ceiling surface 19) is recessed toward the one surface 21 in the direct connection portion 9.

As shown in FIGS. 2 to 3A, the second opening portion 10 is disposed in the outer-side end portion (opposite side of the recessed portion 12 in the recessed direction) in the direct connection portion 9. The second opening portion 10 is oppositely disposed at the outside of the first opening portion 7 at spaced intervals thereto. The second opening portion 10 has a generally rectangular shape when viewed from the top extending in parallel with the first opening portion 7. The second opening portion 10 is one example of a through hole penetrating the direct connection portion 9 in the thickness direction.

Since the fragile portion 26 has the second opening portion 10 and the second thin portion 11 described above, it is fragile as compared with the periphery of the second opening portion 10 and the second thin portion 11.

A width, a thickness, and a depth of the second thin portion 11 are the same as those of the first thin portion 5. A width and a length of the second opening portion 10 are appropriately adjusted in accordance with its application and purpose.

In FIG. 2, the thick one-dot chain line is a line through which the cutting blade 27 (described later) passes, and such a line is a generally rectangular line passing through the first thin portion 5 and the fragile portion 26.

Next, a method for producing the wiring circuit board 3 from the wiring circuit board assembly sheet 1 is described.

In this method, first, a first step of preparing the wiring circuit board assembly sheet 1 and a second step of cutting the first thin portion 5 are provided.

In the first step, for example, first, a metal-based sheet made of the metal-based material (not shown) is prepared, and subsequently, by sequentially forming the base insulating layer (not shown), the conductive layer 25, and the cover insulating layer at one side in the thickness direction of the metal-based sheet, the wiring circuit board 3 is produced. Subsequently, the metal-based sheet is opened to form the first opening portion 7 and the second opening portion 10. Thus, the support sheet 2 and the joint 4 are formed. Further, the first thin portion 5 is formed in the joint 4, and the second thin portion 11 is formed in the support sheet 2. To form the first thin portion 5 and the second thin portion 11, for example, half etching, laser processing, or the like are used, and preferably, from the viewpoint of mass productivity, half etching is used.

Thus, the wiring circuit board assembly sheet 1 is produced.

Then, as shown in FIG. 3A, in the second step, the cutting blade 27 is brought into contact with the one surface 21 of the first thin portion 5 to cut the first thin portion 5. At the same time, the cutting blade 27 is brought into contact with the one surface 21 of the second thin portion 11 to cut the fragile portion 26. That is, the first thin portion 5 and the fragile portion 26 are cut at the same time.

Examples of the cutting blade 27 include a Thomson blade and a dicing blade having a rotatable disk shape. From the viewpoint of simultaneously cutting the first thin portion 5 and the fragile portion 26, preferably, a Thomson blade is used. For example, the Thomson blade has an endless shape when viewed from the top as shown by the thick one-dot dashed line of FIG. 2. Specifically, the Thomson blade has a generally rectangular frame shape capable of passing through the first thin portion 5, the first opening portion 7, and the fragile portion 26 (the second thin portion 11 and the second opening portion 10) when viewed from the top.

As shown in FIG. 3A, in the second step, the cutting blade 27 is disposed at one side in the thickness direction of the wiring circuit board assembly sheet 1, subsequently, though not shown, the cutting blade 27 is moved to the other side in the thickness direction, and the cutting blade 27 is brought into contact with the one surfaces 21 of the first thin portion 5 and the second thin portion 11. Subsequently, by further moving the cutting blade 27 to the other side in the thickness direction to reach the other surfaces 22 of the first thin portion 5 and the second thin portion 11, the first thin portion 5 and the second thin portion 11 are sheared (pressed and cut). Thereafter, the cutting blade 27 is moved to the other side in the thickness direction of the other surfaces 22 of the first thin portion 5 and the second thin portion 11.

Figure 5:
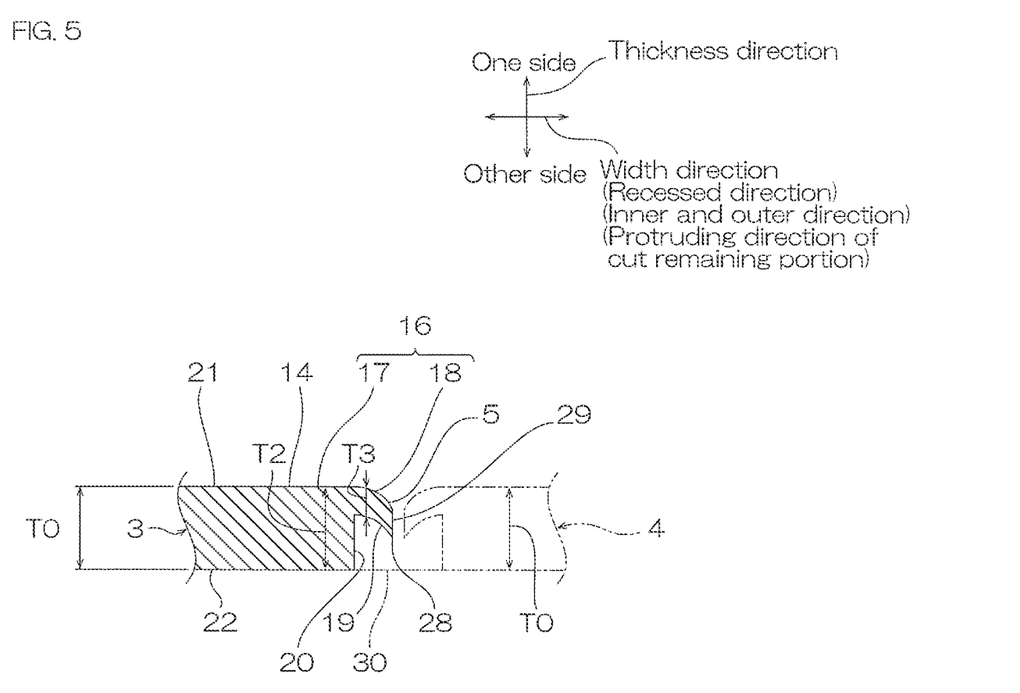
FIG. 5 shows a cross-sectional view along a C-C line of the wiring circuit board of FIG. 4.

As shown in FIG. 5, in the second step, when the first thin portion 5 and the second thin portion 11 (not shown in FIG. 5) are cut with the cutting blade 27, a burr portion 28 protruding toward the other side in the thickness direction is formed. The burr portion 28 remains in the wiring circuit board 3 and the joint 4 in the first thin portion 5, and the direct connection portion 9 in the second thin portion 11.

Among all, since the burr portion 28 leads to a decrease in handleability and mountability in the wiring circuit board 3, it is originally not necessary, and it is unavoidably formed in the second step of the producing method to be described later. In one embodiment, as described later, since the burr portion 28 is formed in the first thin portion 5, the problem described above is solved.

Thus, the joint 4 is disconnected from the support sheet 2 around the direct connection portion 9 together with the direct connection portion 9. Thus, the wiring circuit board 3 is disconnected from the support sheet 2. Specifically, as shown by the thick one-dot chain line of FIG. 2, the joint 4 and the direct connection portion 9 forming a generally T-shape when viewed from the top are removed.

Figure 4:
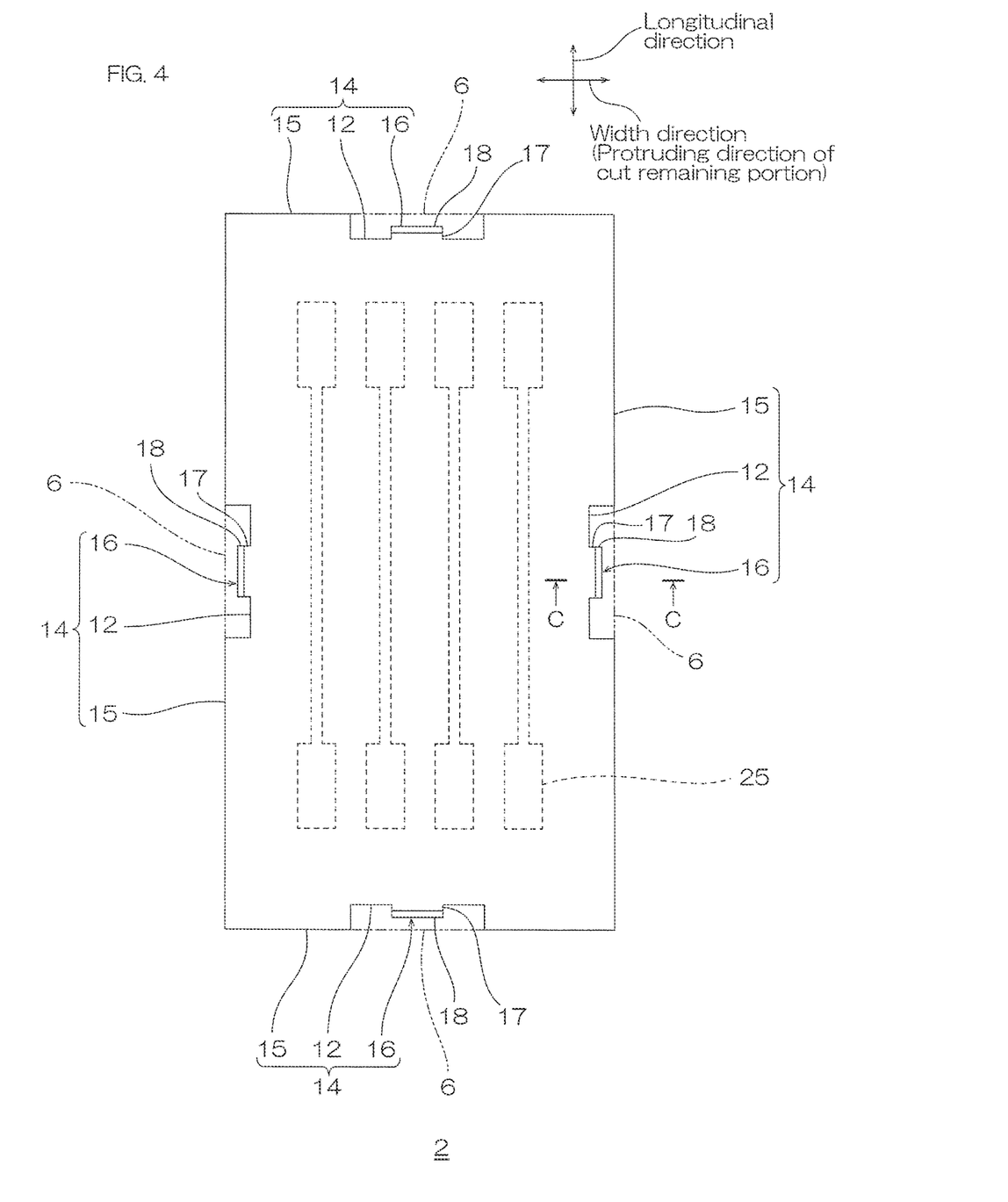
FIG. 4 shows a bottom view of a wiring circuit board disconnected from the wiring circuit board assembly sheet of FIG. 1.

Next, the wiring circuit board 3 which is disconnected from the support sheet 2 is described with reference to FIGS. 4 and 5.

The wiring circuit board 3 has an outer peripheral portion 14 including the outer peripheral end edge 15 and the four recessed portions 12 described above. The outer peripheral portion 14 is not connected to the joint 4 (ref: FIG. 2), i.e., is already disconnected from the joint 4, and further has a cut remaining portion 16 protruding outwardly from the recessed portion 12.

The cut remaining portion 16 integrally has a base end portion 17 and a free end portion 18.

The base end portion 17 has the same thickness T2 as the thickness T0 around the first thin portion 5 in the joint 4.

The free end portion 18 is continuous from one end portion in the thickness direction of the base end portion 17. The one surface 21 of the free end portion 18 is continuous with the one surface 21 of the base end portion 17. On the other hand, the other surface 22 of the free end portion 18 has the ceiling surface 19 and the side surface 20. The ceiling surface 19 of the free end portion 18 is discontinuous with the other surface 22 of the base end portion 17. Thus, the free end portion 18 is thinner than the base end portion 17. The free end portion 18 has a shape that hangs toward the other side in the thickness direction as it goes outwardly. An outer end edge 29 of the free end portion 18 has the burr portion 28 which is a protruding end (front end) protruding toward the other side in the thickness direction. The burr portion 28 is overlapped with the base end portion 17 when projected in a protruding direction of the cut remaining portion 16. Further, the burr portion 28 is located at one side in the thickness direction with respect to a phantom surface 30 (one-dot broken line) along the other surface 22 of the base end portion 17.

The free end portion 18 has a thickness T3 which approximates the thickness T1 of the first thin portion 5 shown in FIG. 3A. The thickness T3 of the free end portion 18 is thinner than a thickness T2 of the base end portion 17. A ratio (T3/T2) of the thickness T3 of the free end portion 18 to the thickness T2 of the base end portion 17 is, for example, (0.7 or less, preferably 0.4 or less, and for example, 0.01 or more, preferably 0.1 or more.

Thereafter, the wiring circuit board 3 is mounted on another substrate which is not shown. Although not shown, another substrate has a flat surface, and the other surface 22 of the wiring circuit board 3 is brought into contact with the flat surface.

In the second step of the method for producing the wiring circuit board 3, as shown in FIG. 3A, since the first thin portion 5 recessed toward the one surface 21 is cut, even when the burr portion 28 protrudes toward the other side in the thickness direction, as shown in FIG. 5, the burr portion 28 is formed in the first thin portion 5, it is possible to locate the burr portion 28 at one side in the thickness direction with respect to the other surface 22 around the first thin portion 5. Therefore, it is possible to suppress a decrease in the handleability of the wiring circuit board 3, and thus, suppress a decrease in the mountability of the wiring circuit board 3.

In the second step of the method for producing the wiring circuit board 3, as shown in FIG. 3A, since the cutting blade 27 is used, it is possible to easily cut the first thin portion 5.

However, though not shown, when the joint 4 includes the direct connection portion 9 without having the fragile portion 26, and in the second step, the direct connection portion 9 is simultaneously cut with the first thin portion 5, the cutting blade 27 in contact with the first thin portion 5 can cut the first thin portion 5 with a relatively small shearing force, and the cutting blade 27 in contact with the direct connection portion 9 cannot cut the thick direct connection portion 9 unless it has a larger shearing force. Furthermore, the shearing force applied to the thick direct connection portion 9 is easily increased as compared with the shearing force applied to the first thin portion 5, and therefore, a difference between the shearing force applied to the direct connection portion 9 and the shearing force applied to the first thin portion 5 becomes excessive. As a result, the horizontal posture of the cutting blade 27 at the time of cutting becomes unstable, and the cutting accuracy is likely to decrease.

However, in the method for producing the wiring circuit board 3, as shown in FIG. 2, since the direct connection portion 9 has the fragile portion 26, as shown in FIGS. 3A to 3B, it is possible to cut the fragile portion 26 with the cutting blade 27 in contact with the fragile portion 26 with a relatively small shearing force. Therefore, it is possible to simultaneously cut both the first thin portion 5 and the direct connection portion 9 using the cutting blade 27 with a relatively small shearing force.

Moreover, it is possible to make the shearing force applied to the fragile portion 26 the same degree as the shearing force applied to the first thin portion 5. Therefore, it is possible to stabilize the posture of the cutting blade 27 at the time of cutting and suppress a decrease in the cutting accuracy.

Further, since the pressure of the cutting blade 27 in contact with the first thin portion 5 decreases, it is possible to decrease an amount of protrusion of the burr portion 28 toward the other side in the thickness direction as much as possible. As a result, it is possible to further suppress a decrease in the handleability of the wiring circuit board 3, and thus, further suppress a decrease in the mountability of the wiring circuit board 3.

Furthermore, since it is possible to decrease the load onto the cutting blade 27, it is possible to decrease the number of replacements of the cutting blade 27, and as a result, it is possible to decrease the production cost.

In the method for producing the wiring circuit board 3, since the fragile portion 26 includes the second thin portion 11 and the second opening portion 10, it is possible to reliably cut the fragile portion 26 with even a small shearing force.

However, though not shown, in the second step, when the first thin portion 5 is located outwardly with respect to the phantom outer peripheral line 6, the first thin portion 5 is likely to interfere at the time of handling or mounting the wiring circuit board 3 which is disconnected from the support sheet 2.

However, in the method for producing the wiring circuit board 3, as shown in FIG. 2, since in the second step, the first thin portion 5 is disposed at the inside of the recessed portion 12 so as to be located inwardly with respect to the phantom outer peripheral line 6 along the outer peripheral end edge 15 when viewed in the thickness direction, it is possible to locate the cutting blade 27 inwardly with respect to the phantom outer peripheral line 6. Therefore, the first thin portion 5 in which the burr portion 28 is formed does not interfere, and it is possible to further suppress a decrease in the handleability and the mountability of the wiring circuit board 3.

In the wiring circuit board assembly sheet 1, as shown in FIG. 3A, since the joint 4 has the first thin portion 5 in which the other surface 22 is recessed toward the one surface 21, as shown in FIG. 5, when the first thin portion 5 recessed toward the one surface 21 is cut, it is possible to locate the burr portion 28 formed in the first thin portion 5 at one side in the thickness direction with respect to the other surface 22 around the first thin portion 5. Therefore, it is possible to suppress a decrease in the handleability of the wiring circuit board 3, and thus, suppress a decrease in the mountability of the wiring circuit board 3.

In the wiring circuit board 3, since the burr portion 28 is overlapped with the base end portion 17 when projected in the protruding direction of the cut remaining portion 16, the burr portion 28 is located at one side in the thickness direction with respect to the other surface 22 around the first thin portion 5. Therefore, the wiring circuit board 3 can suppress a decrease in the handleability and thus, suppress a decrease in the mountability.

Modified Examples

In the following modified examples, the same reference numerals are provided for members and steps corresponding to each of those in the above-described one embodiment, and their detailed description is omitted. Further, each of the modified examples can achieve the same function and effect as that of one embodiment unless otherwise specified. Furthermore, one embodiment and the modified examples can be appropriately used in combination.

Figure 6:
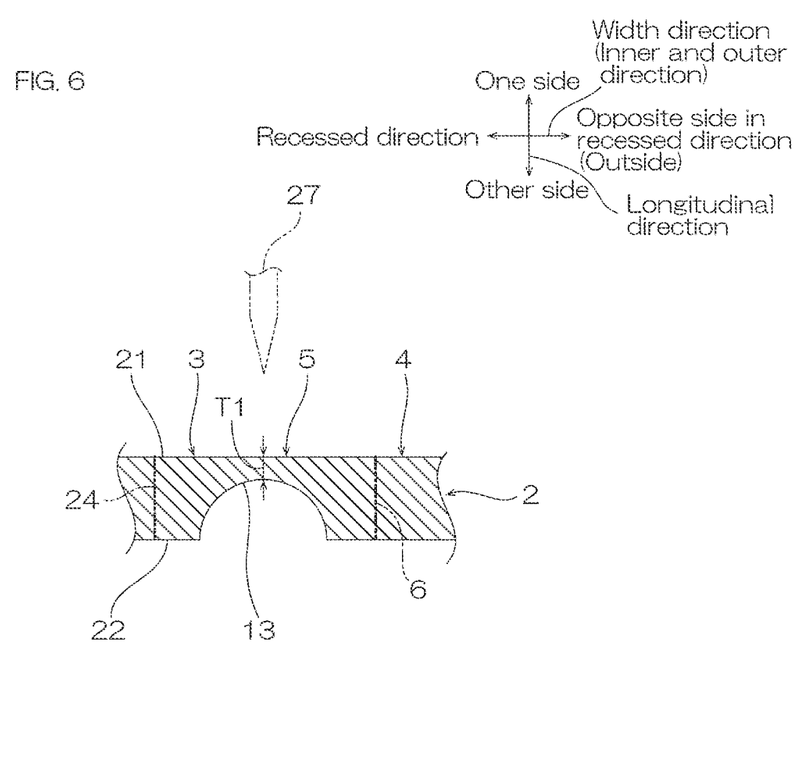
FIG. 6 shows a cross-sectional view of a modified example of a first thin portion shown in FIG. 3A.

As shown in FIG. 3A, the other surface 22 of the first thin portion 5 has the ceiling surface 19 and the side surface 20. Further, for example, as shown in FIG. 6, the other surface 22 of the first thin portion 5 can also have a curved surface 13. The curved surface 13 has a shape of approximating the ceiling surface 19 toward the intermediate portion (central portion) in the width direction (inner and outer direction). In the modified example shown in FIG. 6, the thickness T1 of the first thin portion 5 is the shortest distance in the thickness direction between the one surface 21 and the curved surface 13.

In one embodiment, as shown in FIG. 2, the first thin portion 5 is located inwardly with respect to the phantom outer peripheral line 6 along the outer peripheral end edge 15. Alternatively, for example, though not shown, the first thin portion 5 may be also located outwardly with respect to the phantom outer peripheral line 6.

In one embodiment, the wiring circuit board 3 has the recessed portion 12. Alternatively, for example, though not shown, the wiring circuit board 3 may not also have the recessed portion 12. The cut remaining portion 16 is formed to protrude outwardly from the outer peripheral end edge 15.

As shown in FIG. 2, in one embodiment, the fragile portion 26 has both the second thin portion 1 and the second opening portion 10. Alternatively, as shown in FIGS. 7A to 7B, the fragile portion 26 can also have only one of them.

Figure 7A:
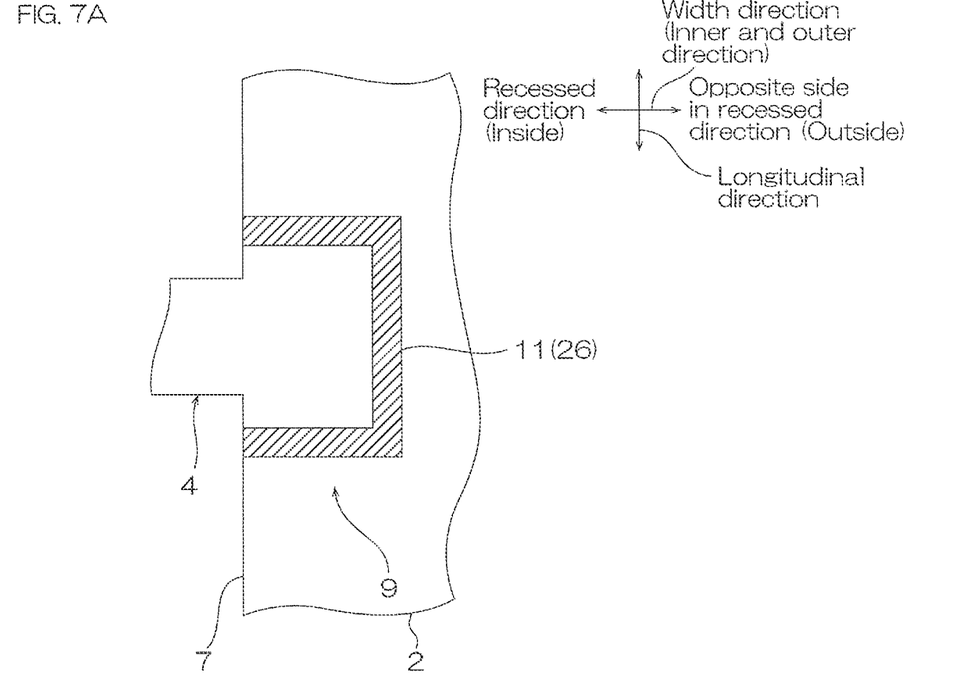
FIG. 7A illustrating a modified example in which the fragile portion consists of only a second thin portion and FIG. 7B illustrating a modified example in which the fragile portion consists of only a second opening portion.

In the modified example shown in FIG. 7A, the fragile portion 26 does not include the second opening portion 10 (ref: FIG. 2), and includes only the second thin portion 11. The second thin portion 11 has a generally U-shape when viewed from the top having an opening toward the first opening portion 7.

Figure 7B:
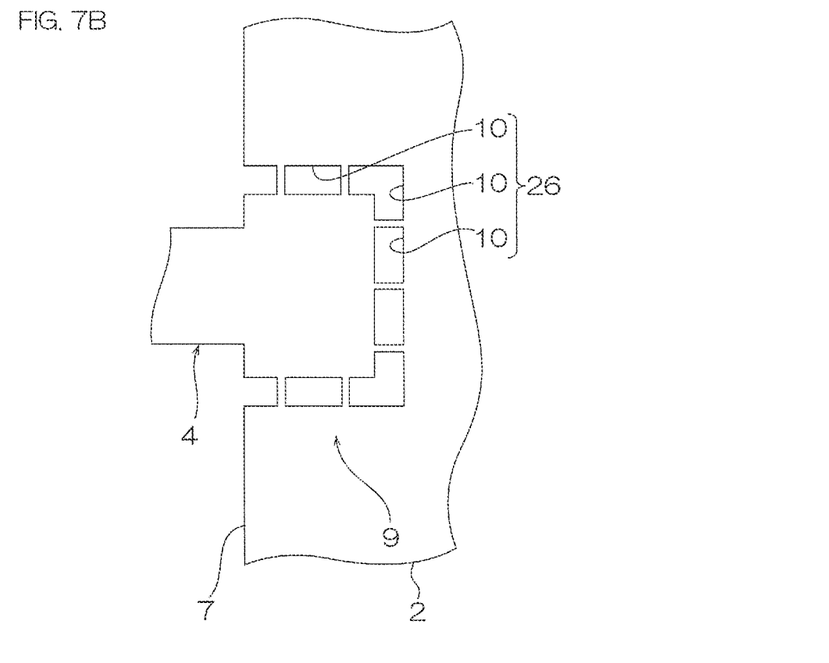

In the modified example shown in FIG. 7B, the fragile portion 26 does not include the second thin portion 11 (ref: FIG. 2), and includes only the second opening portion 10. The plurality of second opening portions 10 are formed, and specifically, the plurality of second opening portions 1 form a perforated cut. The cut has a generally U-shape when viewed from the top having an opening toward the first opening portion 7.

Figure 8:
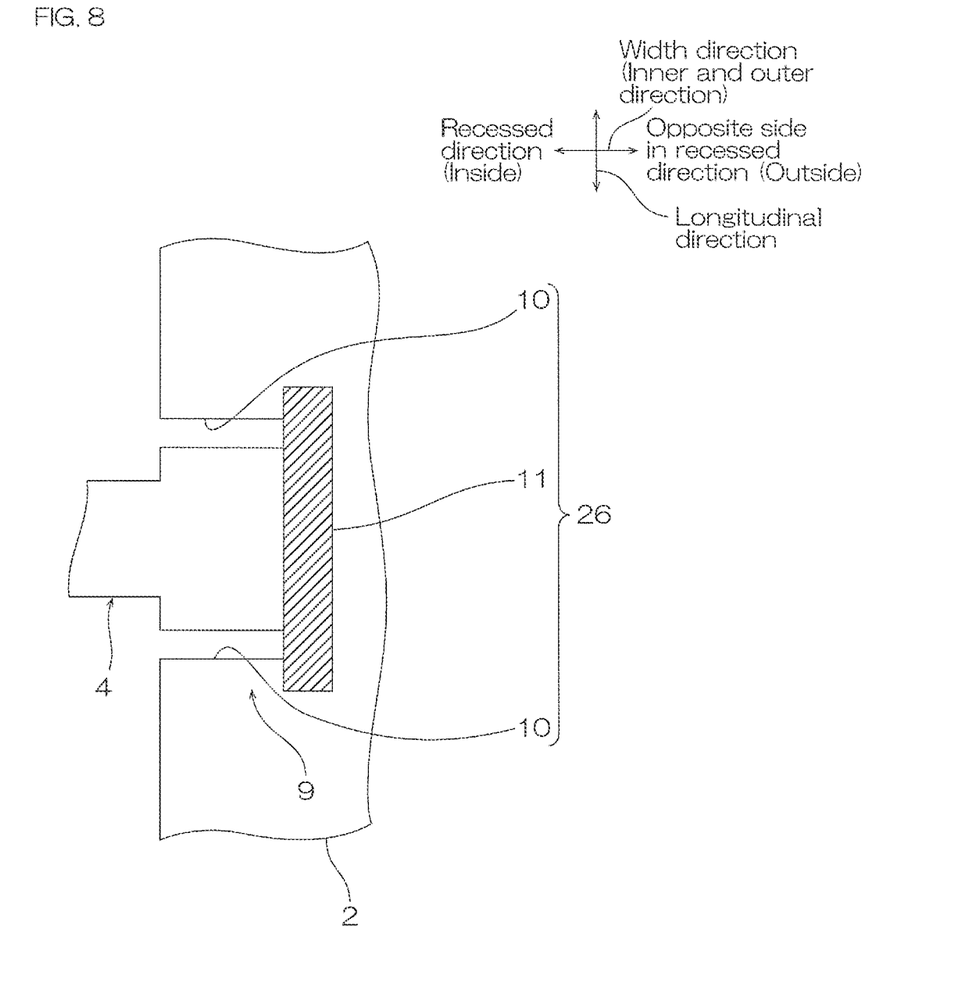
FIG. 8 shows a bottom view of a modified example (embodiment in which a fragile portion includes two second opening portions and one second thin portion) of the fragile portion shown in FIG. 2.

In one embodiment, as shown in FIG. 2, the fragile portion 26 includes the one second opening portion 10 and the two second thin portions 11. However, the number thereof is not limited to this. Alternatively, for example, as shown in FIG. 8, the fragile portion 26 can also include the two second opening portions 10 and the one second thin portion 11. The arrangement and the shape when viewed from the top of the second opening portion 10 and the second thin portion 11 shown in FIG. 8 are the same as those of the second thin portion 11 and the second opening portion 10 shown in FIG. 2, respectively.

In one embodiment, as shown in FIGS. 2 to 3B, the direct connection portion 9 includes the fragile portion 26. Alternatively, though not shown, for example, the direct connection portion 9 may not include the fragile portion 26. In this case, though not shown, the cutting blade 27 may only cut the first thin portion 5.

In one embodiment, as shown in FIGS. 3A to 3B, in the second step, the cutting blade 27 is used. Alternatively, for example, though not shown, it is also possible to use a laser beam.

In the modified example, a laser beam which is not shown is irradiated to the other surface 22. Specifically, a light source (not shown) is disposed at the other side in the thickness direction of the wiring circuit board assembly sheet 1, and in the second step, the laser beam is irradiated from the light source toward the ceiling surface 19 (the other surface 22) of the first thin portion 5. Thus, in the first thin portion 5, the burr portion 28 protruding toward the other side in the thickness direction is formed.

As the laser beam, one that forms the burr portion 28, and can cut the first thin portion 5 and the second thin portion 11 is used. Examples thereof include a gas laser, a solid laser, and a liquid laser, and preferably, a gas laser is used. Examples of the gas laser include a carbon dioxide gas laser, a helium neon laser, an argon ion laser, a carbon dioxide gas laser, and a nitrogen laser, and preferably, a carbon dioxide gas laser is used.

In the modified example, in the second step, since the laser beam is used, it is possible to accurately cut the first thin portion 5.

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

INDUSTRIAL APPLICATION

The wiring circuit board assembly sheet of the present invention is used for producing a wiring circuit board.

DESCRIPTION OF REFERENCE NUMBER

1 Wiring circuit board assembly sheet
2 Support sheet
3 Wiring circuit board
4 Joint
5 First thin portion
6 Phantom outer peripheral line
9 Direct connection portion
10 Second opening portion
11 Second thin portion
12 Recessed portion
14 Outer peripheral portion
15 Outer peripheral end edge
16 Cut remaining portion
17 Base end portion
18 Free end portion
21 One surface
22 Other surface
26 Fragile portion
27 Cutting blade
28 Burr portion
29 Outer end edge

The invention claimed is:

1. A method for producing a wiring circuit board comprising:
   a first step of preparing a wiring circuit board assembly sheet including a support sheet, a plurality of wiring circuit boards supported by the support sheet, and a joint connecting the support sheet to the plurality of wiring circuit boards, having flat-shaped one surface and the other surface facing one surface at spaced intervals thereto in a thickness direction, and having a thin portion in which the other surface is recessed toward one surface and a second step of forming a burr portion protruding toward the other side in the thickness direction and cutting the thin portion.

2. The method for producing a wring circuit board according to claim 1, wherein in the second step, a cutting blade is brought into contact with one surface.

3. The method for producing a wiring circuit board according to claim 2, wherein the support sheet includes a direct connection portion to which the joint is directly connected, the direct connection portion has a fragile portion, and in the second step, the fragile portion is simultaneously cut with the thin portion.

4. The method for producing a wiring circuit board according to claim 3, wherein the fragile portion includes a second thin portion and/or a through hole.

5. The method for producing a wiring circuit board according to claim 1, wherein in the second step, a laser beam is irradiated to the other surface.

6. The method for producing a wiring circuit board according to claim 1, wherein the wiring circuit board has a recessed portion recessed inwardly from an outer peripheral end edge when viewed in the thickness direction, and the thin portion is disposed at the inside of the recessed portion so as to be located inwardly with respect to a phantom outer peripheral line along the outer peripheral end edge when viewed in the thickness direction.

* * * * *